United States Patent [19]

Schädeli

[11] Patent Number: 5,238,781

[45] Date of Patent: Aug. 24, 1993

[54] PHOTOSENSITIVE COMPOSITIONS BASED ON POLYPHENOLS AND ACETALS

[75] Inventor: Ulrich Schädeli, Plasselb, Switzerland

[73] Assignee: Ciba-Geigy Corporation, Ardsley, N.Y.

[21] Appl. No.: 843,799

[22] Filed: Feb. 27, 1992

[30] Foreign Application Priority Data

Mar. 1, 1991 [CH] Switzerland .................. 625/91

[51] Int. Cl.$^5$ ............................................. G03C 1/492
[52] U.S. Cl. ..................................... 430/270; 430/909; 430/927; 522/31; 522/46; 522/129; 522/146
[58] Field of Search ............... 430/270, 271, 909, 927; 522/129, 146, 63, 31, 46

[56] References Cited

U.S. PATENT DOCUMENTS

| | | |
|---|---|---|
| 3,265,708 | 8/1966 | Stiteler . |
| 3,779,778 | 12/1973 | Smith et al. . |
| 3,869,292 | 3/1975 | Peters . |
| 4,247,611 | 1/1981 | Sander et al. ............... 430/286 |
| 4,640,937 | 2/1987 | Hanyuda .................... 522/31 |
| 4,678,737 | 7/1987 | Schneller et al. ............ 430/270 |
| 4,737,426 | 4/1988 | Roth ........................ 430/17 |
| 4,800,152 | 1/1989 | Allen et al. ................ 430/270 |
| 5,079,129 | 1/1992 | Roth et al. ................. 430/280 |

FOREIGN PATENT DOCUMENTS

| | | |
|---|---|---|
| 0361907 | 4/1990 | European Pat. Off. . |
| 0419147 | 3/1991 | European Pat. Off. ........... 430/270 |
| 2342068 | 4/1974 | Fed. Rep. of Germany . |
| 2-125260 | 5/1990 | Japan ........................ 430/270 |

OTHER PUBLICATIONS

PTO-English-language translation of German Patent DE 2,342,068 Apr. 4, 1974.
Polym. Mat. Sci. Eng. 60, (1989), 147-150 and 151-154.
J. Electrochem. Soc., vol. 136, No. 5, May 1989 pp. 1453-1456.
Chem. Abst. 72, 21964u (1970).

Primary Examiner—Marion E. McCamish
Assistant Examiner—Janis L. Dote
Attorney, Agent, or Firm—Luther A. R. Hall; William A. Teoli, Jr.

[57] ABSTRACT

Photosensitive compositions comprising
a) at least one solid film-forming polyphenol,
b) at least one compound of formula I

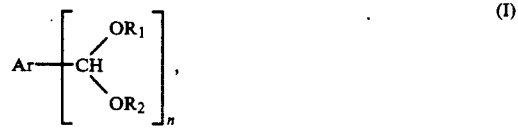

(I)

wherein n is 2, 3 or 4, Ar is an n-valent benzene or naphthalene radical or a divalent radical of formula II

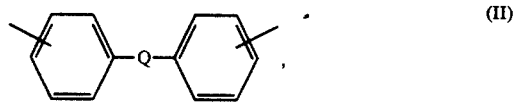

(II)

Q is a direct bond, —O—, —SO—, —SO$_2$—, —CH$_2$—, —C(CH$_3$)(phenyl)- or —C(CH$_3$)$_2$—, each of R$_1$ and R$_2$, independently of the other, is C$_1$-C$_8$alkyl, or phenyl or naphthyl each of which is unsubstituted or substituted by C$_1$-C$_4$alkyl, or R$_1$ and R$_2$ together are 1,2-phenylene or —[C(R')(R'')]$_m$—, each of R' and R'', independently of the other, is hydrogen, C$_1$-C$_4$alkyl or phenyl and m is 2, 3 or 4, and
c) at least one compound that forms an acid under actinic radiation are described.

Those compositions are used as negative resists, especially for producing printing plates, printed circuits and integrated circuits.

22 Claims, No Drawings

PHOTOSENSITIVE COMPOSITIONS BASED ON POLYPHENOLS AND ACETALS

The present invention relates to photosensitive compositions based on solid film-forming polyphenols, an acid generator and certain acetals, and to their use as negative resists for the preparation of protective coatings and relief structures.

Negative resist compositions that work in accordance with the so-called chemical amplification principle are known from the literature. For example, J. M. J. Fréchet et al. in Polym. Mat. Sci-Eng., 60 (1989) 147–150 describe negative resists of the amplification type based on electrophilic aromatic substitution. In that case, inter alia 3-component systems of multi-functional low molecular weight latent electrophiles, such as 1,4-bis-(acetoxymethyl)benzene, an acid-forming triarylsulfonium salt, for example triphenylsolfonium hexafluoroantimonate, and a phenolic polymer, for example a poly(4-hydroxystyrene) or a novolak, are irradiated with UV light at 254 nm, the irradiated areas becoming cross-linked. Similar negative resist systems are known from U.S. Pat. No. 4,800,152, trisacetoxymesitylene being used inter alia as the latent electrophile (cross-linking agent).

In Polym. Mat. Sci. Eng., 60 (1989) 151–154, K. A. Graziano et al. describe acid-catalysed negative resist compositions based on novolaks, a photosensitive acid generator and melamine methylol ethers as cross-linking agents.

On the other hand, it is known that acid-cleavable monomeric or polymeric acetals and ketals, together with photoactivatable acid-forming compounds and, where appropriate, binders, are suitable for the preparation of positive photoresist systems (see, for example, DE-A 2 718 254, U.S. Pat. No. 3,779,778 and EP-A 0 202 196).

It has now been found that, surprisingly, compositions based on solid film-forming polyphenols, an acid generator and certain acetals can be used as negative resist systems that work in accordance with the chemical amplification principle.

The invention therefore relates to photosensitive compositions comprising
a) at least one solid film-forming polyphenol,
b) at least one compound of formula I

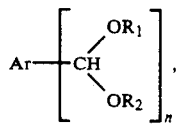

wherein
n is 2,3 or 4, Ar is an n-valent benzene or naphthalene radical or a divalent radical of formula II

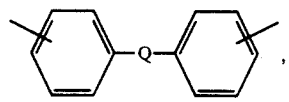

Q is a direct bond-,—O—,—SO—,—SO$_2$—,—CH$_2$—, —C(CH$_3$)(-phenyl)- or —C(CH$_3$)$_2$—, each of R$_1$ and R$_2$, independently of the other, is C$_1$–C$_8$alkyl, or phenyl or naphthyl each of which is unsubstituted or substituted by C$_1$–C$_4$alkyl, or R$_1$ and R$_2$ together are 1,2-phenylene or —[C(R')(R")]$_m$—, each of R' and R", independently of the other, is hydrogen, C$_1$–C$_4$alkyl or phenyl and m is 2,3 or 4, and c) at least one compound that forms an acid under actinic radiation.

Examples of suitable di- to tetra-valent benzene and naphthalene radicals Ar are 1,3-and 1,4-phenylene, benzene-1,2,3-triyl, benzene-1,2,4-triyl, benzene-1,3,5-triyl, benzene-1,2,4,5-tetrayl, 1,4-, 1,5-, 2,6- and 2,7-naphthylene, naphthalene-1,2,5-triyl, naphthalene-1,4,5-triyl, and naphthalene-1,4,5-8-tetrayl. Radicals of formula II are preferably bonded in the 3,3'- and especially in the 4,4'-position. Q is preferably a direct bond,—CH$_2$—or —SO$_2$—. Ar is preferably an n-valent benzene radical, especially 1,3-phenylene and very especially 1,4-phenylene (n=2).

Alkyl groups R$_1$, R$_2$, R'or R" or alkyl substituents contained therein may be straight-chained or branched. Examples that may be mentioned are: methyl, ethyl, propyl, isopropyl, n-, sec- and tert-butyl and- in the case of R$_1$ and R$_2$-also n-pentyl, 2-methylpentyl, n-hexyl, n-heptyl and n-octyl.

Phenyl and naphthyl groups R$_1$ and R$_2$ may be mono- to tri-substituted by C$_1$–C$_4$alkyl, especially methyl or ethyl. Preference is given to those that are substituted by one or two methyl or ethyl groups. Special preference is given, however, to unsubstituted naphthyl and especially to unsubstituted phenyl. R' and/or R" are preferably hydrogen or methyl.

R$_1$ and R$_2$ preferably have the same meaning and are especially C$_1$–C$_4$alkyl. Especially preferably they are together 1,2-phenylene and especially —[C(R')(R")]$_m$—, wherein R' and/or R"=H or methyl and m is 2 or 3.

The compounds of formula I are advantageously used in an amount of from 5 to 50% by weight, preferably from 10 to 30% by weight, based on component a).

The compounds of formula I are known or can be prepared in a manner known per se, for example by reacting a corresponding aldehyde of formula Ia

with pyrocatechol, a monohydroxy compound HOR$_1$ or HOR$_2$ or a dihydroxy compound HO—[C(R')(R")]$_m$—OH, wherein Ar, n, R$_1$, R$_2$, R', R" and m are as defined above.

The aldehydes of formula Ia are likewise known or can be obtained by methods known per se, for example by
1. reduction of the corresponding carboxylic acids with formic acid in the presence of a catalyst, such as MnCO$_3$,
2. catalytic hydrogenation of the corresponding carboxylic acid chlorides, for example with Pd on BaSO$_4$ and, where appropriate, in the presence of small amounts of quinoline (Rosenmund reduction),
3. oxidation of the corresponding hydroxymethyl compounds,
4. oxidation of the corresponding aminomethyl compounds in the presence of copper,
5. Sommelet reaction of the corresponding chloromethyl compounds (with the exception of the o-dialdehydes).

Compounds of formula Ia wherein Ar is a di- to tetravalent benzene or naphthalene radical are preferably prepared from the corresponding carboxylic acids or carboxylic acid chlorides. Compounds of formula Ia wherein Ar is a divalent radical of the formula

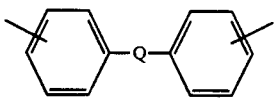

are advantageously prepared from the corresponding bis(hydroxymethyl) or bis(aminomethyl) compounds. In those compounds the hydroxymethyl or aminomethyl groups are preferably in the 3,3'-position and especially in the 4,4'-position.

The binder a) is a solid film-forming polyphenol, i.e. a polymer that has a specific content of phenolic hydroxy groups. That content should be at least high enough to ensure development or at least swelling in an aqueous-alkaline developer solution.

Suitable alkaline-aqueous soluble film-forming binders a) can be divided generally into the following groups:

i) novolaks comprising at least one phenol and at least one aldehyde,
ii) homo- and co-polymers of alkenylphenols and
iii) homo- and co-polymers of N-hydroxphenylmaleimides.

Preference is given to group ii).

Preferred novolaks i) are compounds that are derived from a $C_1$–$C_6$aldehyde, for example formaldehyde or acetaldehyde, and a dinuclear, but preferably a mononuclear, unsubstituted or substituted phenol. Examples of preferred phenols are phenol itself or phenols substituted by one or two $C_1$–$C_9$alkyl groups, for example o-, m- or p-cresol, xylenol, p-tert-butylphenol and o-, m- or p-nonylphenol, or phenols substituted by one or two halogen atoms, preferably chlorine or bromine, for example p-chlorophenol, phenols substituted by a phenyl nucleus, for example p-phenylphenol, or phenols having more than one phenolic group, for example resorcinol, bis(4-hydroxyphenyl)methane or 2,2-bis-(4-hydroxyphenyl)propane.

Preferred homo- or co-polymers of alkenylphenols ii) are especially those having structural repeating units of formula III

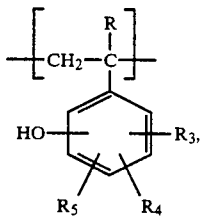

(III)

wherein R is hydrogen or methyl, each of $R_3$, $R_4$ and $R_5$, independently of the others, is hydrogen, $C_1$–$C_4$alkyl, $C_1$–$C_4$alkoxy, halogen, especially chlorine or bromine, or methylol. The phenolic hydroxy group is arranged in the o-, m- or p-position relative to the alkenyl group, but preferably in the p-position.

Examples of suitable comonomers are vinyl monomers that are free of carboxy groups. Examples of such monomers are styrene, acrylic and methacrylic acid esters, especially (meth)acrylic acid methyl ester or (meth)acrylic acid 2-hydroxyethyl ester, acrylamide, vinyl acetate and N-substituted maleimides.

The comonomer content of binders of type ii) is preferably 0–50 mol %, based on the total polymer.

Polymers of type ii) are known and are described, for example, in DE-A 2 322 230 and EP-A 153 682. Some of those polymers are also available commercially.

Preferred binders of type iii) are homopolymers of N-hydroxyphenylmaleimides. Preference is given to homopolymers having the structural unit of formula IV

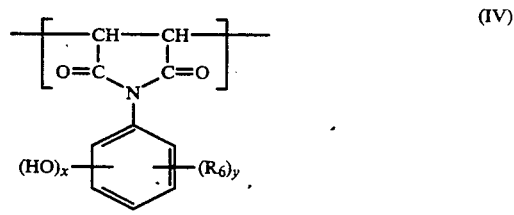

(IV)

wherein $R_6$ is $C_1$–$C_4$alkyl, $C_1$–$C_4$alkoxy or halogen, especially chlorine or bromine, x is 1, 2 or 3, y is 0, 1, 2, 3 or 4 and the sum of x and y is not more than 5, and the radicals $R_6$ may defer from a phenyl nucleus within the given definitions.

If $R_3$, $R_4$, $R_5$ or $R_6$ is $C_1$–$C_4$alkyl, it is a straight-chain or branched, preferably straight-chain, alkyl radical. Examples of such groups are methyl, ethyl, n-propyl, isopropyl, n-butyl or sec-butyl. Methyl is preferred.

As $C_1$–$C_4$alkoxy, the alkyl moiety of $R_3$, $R_4$, $R_5$ or $R_6$ is as defined above by way of example. Methoxy is preferred.

As halogen, $R_3$, $R_4$, $R_5$ or $R_6$ is fluorine, chlorine, bromine or iodine. Chlorine or bromine, especially bromine, is preferred.

The index x in the structural element of formula IV is preferably 1 or 2, especially 1. The index y in the structural element of formula IV is preferably 0, 1 or 2, especially 0.

A further preferred group of binders of type iii) are copolymers based on N-hydroxyphenylmaleimides, especially those having structural elements of formula IV and compounds that are free of carboxy groups.

Examples of suitable vinyl comonomers are:

A) styrene types, for example styrene, α-methylstyrene, p-methylstyrene or p-hydroxyphenylstyrene;
B) esters or amides of α,β-unsaturated acids, for example acrylic acid methyl ester, acrylic acid amide, the corresponding methacrylic compounds or maleic acid methyl ester;
C) nitriles of α,β-unsaturated acids, for example acrylonitrile or methacrylonitrile;
D) halogenated vinyl compounds, for example vinyl chloride, vinyl fluoride, vinylidene chloride or vinylidene fluoride;
E) vinyl esters, for example vinyl acetate or
F) vinyl ethers, for example methyl vinyl ether or butyl vinyl ether.

The proportion of vinyl component is generally from 0 to 95 mol %, preferably 0–75 mol %, especially 0–50 mol %, based on the total amount of monomer units.

Homopolymers consisting of structural units of formula IV and copolymers with vinyl compounds are known and are described, for example, in BE-A 613 801 and in Kobunshi Kagaku 26, 593–601 (1969) (Chem. Abstr. 72, 21964n).

A further especially preferred group of binders of type iii) are copolymers based on N-hydroxymaleimides, especially those having structural elements of formula IV, allyl compounds and, where appropriate, further vinyl compounds.

Additional binders of type iii) are described in EP-A 0 255 989.

It is especially preferred to use as binder a) a novolak, preferably a phenol or cresol novolak, and especially binders of type ii), especially homo- and co-polymers of hydroxystyrenes. Very especially preferred are commercially available poly(p-hydroxystyrenes). Those compounds generally have a molecular weight (Mw) of from 1000 to 100 000, measured by gel permeation chromatography, especially from 4000 to 25 000.

Suitable compounds c) that form an acid under actinic radiation are especially onium salts, such as diazonium, sulfonium, sulfoxonium and iodonium salts. Preference is given to sulfonium salts of formula V

wherein $Ar_1$ is phenyl, naphthyl or phenyl—$COCH_2$—, each of which is unsubstituted or substituted by halogen, $C_1$-$C_4$alkyl, $C_1$-$C_4$alkoxy, —OH and/or by nitro, $R_7$ is $C_1$-$C_6$alkyl or $C_3$-$C_7$cycloalkyl and $R_8$ is tetrahydrothienyl, tetrahydrofuryl or hexahydropyrryl, q is 0, 1, 2 or 3, r is 0, 1 or 2 and s is 0 or 1, the sum of $q+r+s$ being 3, and $X^\ominus$ is a chloride, bromide or iodide anion, $BF_4^\ominus$, $PF_6^\ominus$, $AsF_6^\ominus$, $SbF_6^\ominus$, $FSO^\ominus$ or the anion of an organic sulfonic acid or carboxylic acid.

Phenyl, naphthyl and phenacyl groups $Ar_1$ are preferably monosubstituted, especially by Cl, Br, methyl, methoxy, —OH or by nitro. Those radicals are especially unsubstituted. $R_7$ is preferably $C_1$-$C_4$alkyl, especially methyl or ethyl. Preferably q is 2 or 3, r is 1 or zero and s is zero, and q is especially 3 and r and s are especially zero. $Ar_1$ is most preferably unsubstituted phenyl and q is most preferably 3.

When $X^\ominus$ is the anion of an organic sulfonic acid or carboxylic acid, it may be an anion of an aliphatic, cycloaliphatic, carbocyclic-aromatic, heterocyclic-aromatic or araliphatic sulfonic or carboxylic acid. These anions may be substituted or unsubstituted. Preference is given to sulfonic and carboxylic acids that are only weakly nucleophilic, for example partially fluorinated or perfluorinated derivatives or derivatives substituted in a position adjacent to the particular acid group. Examples of substituents are halogen, such as chlorine or especially fluorine, alkyl, such as methyl, ethyl or n-propyl, or alkoxy, such as methoxy, ethoxy or n-propoxy.

Examples of aliphatic sulfonic acids are methane-, ethane-, n-propane-, n-butane- and n-hexane-sulfonic acid or the corresponding partially fluorinated or perfluorinated derivatives thereof.

Examples of aliphatic carboxylic acids are formic acid, acetic acid, propionic acid, butyric acid, pivalic acid, caproic acid, 2-ethylhexylcarboxylic acid and fatty acids, such as lauric acid, myristic acid or stearic acid, as well as the partially fluorinated or perfluorinated derivatives of those acids.

Examples of cycloaliphatic sulfonic or carboxylic acids are cyclohexanesulfonic acid, cyclohexanecarboxylic acid, camphor-10-sulfonic acid or the partially fluorinated or perfluorinated derivatives thereof.

Examples of carbocyclic-aromatic sulfonic acids are benzene-, toluene-, ethylbenzene-, isopropylbenzene-, dodecylbenzene- or dimethylbenzene-sulfonic acid, 2,4,6-triisopropylbenzenesulfonic acid, 2,4,6-trimethylbenzenesulfonic acid, naphthalenesulfonic acid, the corresponding disulfonic acids or trisulfonic acids, and the corresponding alkylated or partially fluorinated or perfluorinated derivatives of those sulfonic acids.

Examples of heterocyclic-aromatic sulfonic acids are pyridine-, thiophene- or pyrrolesulfonic acid and the corresponding partially fluorinated or perfluorinated derivatives of those acids.

Examples of araliphatic sulfonic acids are benzylsulfonic acid, α-methylbenzylsulfonic acid and the corresponding partially fluorinated or perfluorinated derivatives of those compounds.

Examples of carbocyclic-aromatic carboxylic acids are benzoic acid, toluene-, ethylbenzene-, isopropylbenzene- or dimethylbenzene-carboxylic acid, naphthalenecarboxylic acid or anthracenecarboxylic acid and the corresponding partially fluorinated or perfluroinated derivatives of those compounds.

Examples of heterocyclic-aromatic carboxylic acids are pyridine-, thiophene-or pyrrolecarboxylic acids as well as the corresponding partially fluorinated or perfluorinated derivatives of those compounds.

Examples of araliphatic carboxylic acids are benzylcarboxylic acid, α-methylbenzylcarboxylic acid and cinnamic acid, as well as the corresponding partially fluorinated or perfluorinated derivatives of those compounds.

$X^{63}$ is preferably the monovalent anion of an organic sulfonic acid, especially a partially fluorinated or perfluorinated sulfonic acid. Those anions are distinguished by the fact that they are especially weakly nucleophilic.

Specific examples of suitable sulfonium salts of formula V are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyl dimethylsulfonium chloride, phenacyl tetrahydrothiophenium chloride, 4-nitrophenacyl tetrahydrothiophenium choride and 4-hydroxy-2-methylphenyl hexahydrothiopyrylium chloride. Triphenylsulfonium trifluoromethanesulfonate is especially preferred.

There may also be used as compounds c) iodonium salts of formula VI

wherein each of $Ar_2$ and $Ar_3$, independently of the other, is phenyl or naphthyl each of which is unsubstituted or substituted by $C_1$-$C_4$alkyl, $C_1$-$C_4$alkoxy, halogen and/or by nitro, or $Ar_2$ and $Ar_3$ together are a group of formula VII

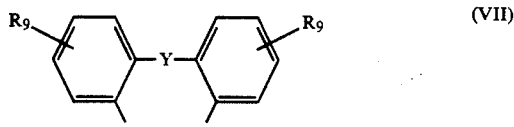

wherein $R_9$ is $C_1$-$C_4$alkyl, $C_1$-$C_4$alkoxy, halogen or nitro and Y is a direct bond, —O—, —$CH_2$— or —CO— and $X_1^\ominus$ is a chloride, bromide or iodide anion. Iodonium salts of formula VI are described, for example, in GB-A 1 539 192.

Also suitable as compounds c) are compounds of formulae VIII to XIV that generate sulfonic acid under actinic radiation

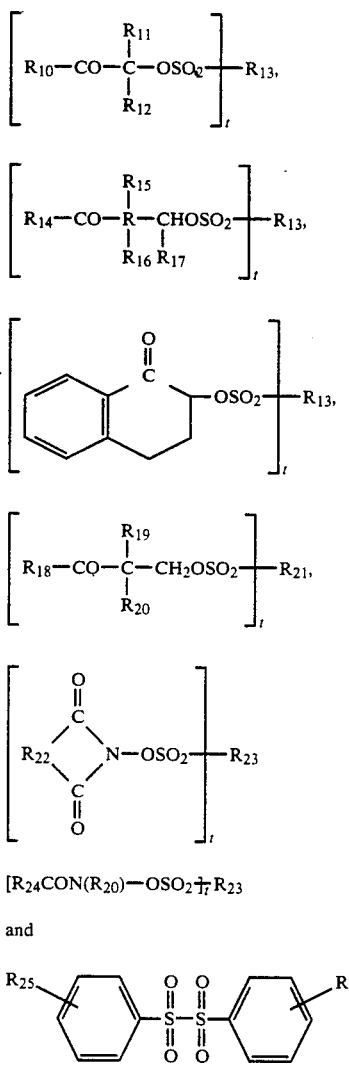

wherein t is 1 or 2, preferably 1, $R_{10}$ is phenyl or naphthyl each of which is unsubstituted or mono- to tri-substituted by —Cl, —Br, —CN, —NO$_2$, $C_1$-$C_4$alkyl, $C_1$-$C_4$alkoxy, $C_1$-$C_4$alkylthio, phenoxy, phenylthio, $C_1$-$C_4$alkylamino, $C_2$-$C_4$dialkylamino or by benzoyl, especially phenyl that is unsubstituted or monosubstituted by —Cl, methyl or by methoxy, $R_{11}$ is hydrogen or $C_1$-$C_4$alkyl and $R_{12}$ is hydrogen, $C_1$-$C_4$alkyl or phenyl, or $R_{11}$ and $R_{12}$, together with the linking carbon atom, form a cyclopentane or cyclohexane ring, $R_{13}$, when t=1, is $C_1$-$C_{18}$alkyl, or phenyl or naphthyl each of which is unsubstituted or substituted by $C_1$-$C_4$alkyl, or is cyclopentyl, cyclohexyl or camphoryl, and, when t=2, is $C_2$-$C_8$alkylene or phenylene, $R_{14}$ is phenyl or naphthyl each of which is unsubstituted or mono- to tri-substituted by —Cl, —Br, $C_1$-$C_4$alkyl, $C_1$-$C_4$alkoxy, $C_1$-$C_4$alkylthio, phenyl, phenoxy, phenylthio, $C_1$-$C_4$alkyl—CONH—, benzoylamino or by dimethylamino, especially phenyl that is unsubstituted or monosubstituted by —Cl, $C_1$-$C_4$alkoxy, methylthio or by phenyl, $R_{15}$ is —OH or $C_1$-$C_4$alkyl, $R_{16}$ is $C_1$-$C_4$alkyl or phenyl, $R_{17}$ is hydrogen, $C_1$-$C_4$-alkyl, furyl or —CCl$_3$, or $R_{16}$ and $R_{17}$, together with the linking carbon atom, form a cyclopentane or cyclohexane ring, each of $R_{18}$ and $R_{19}$, independently of the other, is phenyl that is unsubstituted or substituted by halogen, $C_1$-$C_4$alkyl or by $C_1$-$C_4$alkoxy, $R_{20}$ is hydrogen or $C_1$-$C_4$alkyl, $R_{21}$, when t=1, is $C_1$-$C_6$alkyl, phenyl, naphthyl or benzyl and, when t=2, is $C_1$-$C_6$alkylene, phenylene or xylylene, $R_{22}$ is phenylene or naphthylene each of which is unsubstituted or substituted by halogen, nitro, $C_1$-$C_4$alkyl, $C_1$-$C_4$alkoxy or by $C_1$-$C_4$alkylthio, or is —CH=CH—, $R_{23}$, when t=1, is $C_1$-$C_{12}$alkyl, or phenyl that is unsubstituted or substituted by halogen, nitro, $C_1$-$C_4$alkyl or by $C_1$-$C_4$alkoxy, and, when t=2, is $C_2$-$C_8$alkylene or phenylene, $R_{24}$ is phenyl or naphthyl each of which is unsubstituted or substituted by halogen, nitro, —CN, $C_1$-$C_4$alkyl, methoxy, ethoxy, dimethylamino or by benzoyl and each of the radicals $R_{25}$, independently of the another, is $C_1$-$C_4$alkyl.

Alkyl, alkoxy, alkylthio, alkylamino, dialkylamino, alkylcarbamoyl and alkylene groups according to the definitions may be straight-chain or branched, but are preferably straight-chain. Halogen is especially —Cl or —Br.

Compounds of formulae VIII to XIII are described, for example, in EP-A 0 166 682 and 0 085 024 and in the literature cited therein. Especially preferred compounds of formulae VIII to XIII are phenacyl p-methylbenzenesulfonate, benzoin p-toluenesulfonate, 3-(p-toluenesulfonyloxy)-2-hydroxy-2-phenyl-1-phenyl-1-propanone[α-(p-toluenesulfonyloxy)methylbenzoin], N-(p-dodecylbenzenesulfonyloxy)-1,8-naphthalimide and N-(phenylsulfonyloxy)-1,8-naphthalimide.

Further suitable compounds c) are o-nitrobenzaldehydes that are rearranged under actinic radiation to form o-nitrosobenzoic acids, such as 1-nitrobenzaldehyde and 2,6-dinitrobenzaldehyde; α-haloacyl phenones, such as α,α,α-trichloroacetophenone and p-tert-butyl-α,α,α-trichloroacetophenone, and sulfonic acid esters of o-hydroxyacyl phenones, such as 2-hydroxybenzophenone methanesulfonate and 2,4-hydroxybenzophenone bis(methanesulfonate).

Finally, suitable compounds c) are also those which contain chlorine or bromine bonded to an aromatic nucleus, such as those described, for example, in EP-A 0 318 649, for example compounds of formula XV

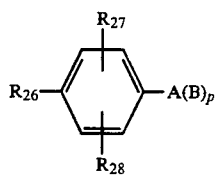

having at least one chlorine or bromine atom bonded to an aromatic nucleus, wherein, for example, p is 0 or 1, $R_{26}$ is —COOH, —OR$_{29}$ or —SR$_{29}$, each of $R_{27}$ and $R_{28}$, independently of the other, is hydrogen, —Cl, —Br, alkyl that is unsubstituted or substituted by aryl, alkoxy, aryloxy, —OH or by —F, or aryl that is unsubstituted or substituted by alkoxy, aryloxy, —OH or by halogen, $R_{29}$ is hydrogen, or alkyl or aryl each of which is unsubstituted or substituted analogously to $R_{27}$, or is acyl, A, when p=0, is hydrogen, —Cl or —Br, or alkyl that is unsubstituted or substituted analogously to $R_{27}$, and, when p=1, is —SO$_2$—, propylene or perfluoroalkylene, and B is a group

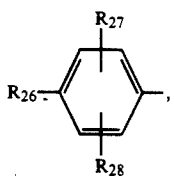

alkylcarbonyl, alkoxycarbonyl or substituted sulfonylimidocarbonyl.

Examples of such compounds are hexafluorotetrabromo-bisphenol A, 1,1,1-tris(3,5-dibromo-4-hydroxyphenyl)ethane and N-(2,4,6-tribromophenyl)-N'-(p-toluenesulfonyl)-urea.

It is especially preferred to use as compounds c) those of formula V wherein $Ar_1$ is phenyl, q is the number 3 and $X^\ominus$ is $SbF_6^\ominus$, $PF_6^\ominus$ and especially the anion of an aliphatic, partially fluorinated aliphatic or perfluorinated aliphatic sulfonic acid or of an aromatic, partially fluorinated aromatic or perfluorinated aromatic sulfonic acid. Especially preferred anions $X^\ominus$ are $CF_3SO_3^\ominus$, $C_2F_5SO_3^\ominus$, $n-C_3F_7SO_3^\ominus$, $n-C_4F_9SO_3^\ominus$, $n-C_6F_{13}SO_3^\ominus$, $n-C_8F_{17}SO_3^\ominus$ and $C_6F_5SO_3^\ominus$. There is most preferably used as compound c) triphenylsulfonium trifluoromethanesulfonate.

The compounds c) are advantageously used in an amount of from 1 to 30% by weight, especially from 1 to 20% by weight and very especially from 1 to 10% by weight, based on a)+b).

The compositions according to the invention may comprise other customary additives, for example stabilisers, pigments, dyes, fillers, adhesion promoters, leveling agents, wetting agents and plasticisers. For the purpose of application, the compositions are preferably dissolved in suitable solvents [(component d)].

The compositions according to the invention, dissolved in a solvent or a mixture of solvents, are outstandingly suitable as coating compositions for substrates of all types, for example wood, textiles, paper, ceramics, glass, plastics, such as polyesters, polyethylene terephthalate, polyolefins or cellulose acetate, especially in the form of films, and metals, such as Al, Cu, Ni, Fe, Zn, Mg or Co, and GaAs, Si or $SiO_2$, to which an image is to be applied by image-wise exposure.

The choice of solvent and the concentration are governed primarily by the nature of the composition and the coating method. The solvent should be inert, i.e. it should not react chemically with the components, and it should be capable of being removed during drying after the coating operation. Suitable solvents are, for example, ketones, ethers and esters, such as methyl ethyl ketone, isobutyl methyl ketone, cyclopentanone, cyclohexanone, N-methylpyrrolidone, dioxane, tetrahydrofuran, 2-methoxyethanol, 2-ethoxyethanol, 1-methoxy-2-propanol, 1,2-dimethoxyethane, ethyl acetate, n-butyl acetate and 3-ethoxypropionic acid ethyl ester.

The solution is applied uniformly to a substrate by means of known coating methods, of example by spin-coating, dip-coating, doctor coating, curtain coating, brushing, spraying, especially electrostatic spraying and reverse-roll coating. It is also possible to apply the photosensitive coating to a temporary, flexible carrier and then to coat the final substrate, for example a copper-clad circuit board, by coating transfer by lamination.

The amount applied (coating thickness) and the nature of the substrate (coating carrier) depend on the desired field of application. The range of coating thickness is generally from approximately 0.1 μm to more than 10 μm.

The photosensitive compositions according to the invention are used as negative resists that have a very high degree of photosensitivity and can be developed in an aqueous-alkaline medium without swelling. They are suitable as photoresists for electronics (electroplating resist, etching resist, solder resist), for the manufacture of printing plates, such as offset printing plates or screen-printing blocks, for use in the etching of mouldings or for use as microresists in the manufacture of integrated circuits. The possible coating substrates and the processing conditions of the coated substrates are correspondingly varied.

For the recording of photographic information, for example films of polyester, cellulose acetate or plastics-coated papers are used; for offset printing blocks specially treated aluminium is used, for the manufacture of printed circuits copper-clad laminates are used and for the manufacture of integrated circuits silicon wafers are used. The coating thickness for photographic materials and offset printing blocks are generally approximately from 0.5 μm to 10 μm, for printed circuits from 0.4 to approximately 2 μm.

Using the compositions according to the invention it is possible to produce high-resolution relief structures of negative tonality. Owing to the high sensitivity and the high optical transparency or; in other words, the low optical absorption in the UV range around 250 nm, they are especially suitable for use in microlithography, especially for use in deep UV microlithography. Owing to those properties, very steep wall profiles can be obtained and the resolution of submicron structures (down to 0.5 μm) can be achieved; such submicron structures cannot be produced, for example, with corresponding compositions containing two acetoxymethyl functions in the copolymer molecule.

When the substrates have been coated, the solvent is generally removed by drying, resulting in a coating of photoresist on the carrier.

The expression "image-wise" exposure includes exposure through a photomask containing a predetermined pattern, for example a diapositive, exposure by a laser beam which is moved over the surface of the coated substrate, for example by computer-control, and thus produces an image, and irradiation with computer-controlled electron beams.

The photosensitivity of the compositions according to the invention generally extends from the UV region (approximately 200 nm) to approximately 600 nm and thus spans a very broad range: A large number of very different types of light source are therefore used. Both point sources and arrays of reflector lamps are suitable. Examples are: carbon arc lamps, xenon arc lamps, mercury vapour lamps, optionally doped with metal halides (metal halide lamps), fluorescent lamps, argon glow lamps, electronic flash lamps, photographic floodlights, electron beams and X-rays produced by means of synchrotrons or laser plasma. The distance between the lamp and the image material according to the invention may vary according to the intended use and the type and/or intensity of the lamp, for example from 2 cm to 150 cm. Laser light sources, for example excimer lasers, such as krypton-fluoride lasers, for exposure at 248 nm are especially suitable. In that case the high sensitivity of the materials according to the invention is very advantageous. By this method it is possible to produce printed circuits in the electronics industry, lithographic offset printing plates or relief printing plates, as well as photographic image-recording materials.

After the image-wise exposure of the material and before developing it may be advantageous to carry out a short thermal treatment. In that treatment only the exposed parts are thermally cured. The temperatures used are generally from 50° to 150° C., preferably from 80° to 130° C.; the period of thermal treatment is generally from 0.25 to 10 minutes.

After the exposure and, where appropriate, the thermal treatment, the unexposed areas of the photosensitive resist are removed in a manner known per se using a developer.

As already mentioned, the compositions according to the invention can be developed in an aqueous-alkaline medium. Suitable aqueous-alkaline developer solutions are especially aqueous solutions of tetraalkylammonium hydroxides or alkali metal silicates, phosphates, hydroxides and carbonates. Where appropriate, relatively small amounts of wetting agents and/or organic solvents may also be added to those solutions. Typical organic solvents that can be added in small amounts to the developer fluids are, for example, cyclohexanone, 2-ethoxyethanol, toluene, acetone and mixtures of such solvents. The compositions according to the invention are suitable especially for the manufacture of printing plates, printed circuits and integrated circuits.

The Examples that follow illustrate the invention in detail. In the Examples parts and percentages are by weight, unless otherwise indicated.

EXAMPLES 1-4

Preparation of Compounds of Formula I

EXAMPLE 1

2,2'-(1,4-phenylene)bis-1,3-dioxolane

In a 250 ml round-bottomed flask equipped with a magnetic stirrer and a water-separator, 100 ml of toluene are added to 7.24 g (54 mmol) of terephthalic aldehyde, 7.45 g (120 mmol) of ethylene glycol and 0.2 g (1 mmol) of p-toluenesulfonic acid monohydrate. The reaction mixture is refluxed for 2 hours, cooled and neutralised twice with 100 ml of 0.1N sodium hydroxide solution each time. The organic phase is washed three times with 50 ml of water each time, dried over magnesium sulfate and concentrated. The resulting product is then recrystallised from cyclohexane, yielding 6.8 g (31 mmol, 58% of the theoretical yield) of 2,2'-(1,4-phenylene)bis-1,3-dioxolane in the form of white crystals; m.p. 86°-89° C. $^1$H-NMR (CDCl$_3$, 100 MHz): δ 7.49/s/4H, 5.84/s/2H, 4.06/m/8H.

UV spectrum (CH$_2$Cl$_2$): $\epsilon_{250\ nm}=840$.

Elementary analysis: calculated C 64.85% H 6.35% found C 61.79% H 6.33%.

EXAMPLE 2

2,2'-(1,4-phenylene)bis-1,3-dioxane

Analogously to the procedure described in Example 1, 9.9 g (39.6 mmol, 73% of the theoretical yield) of 2,2'-(1,4-phenylene)bis-1,3-dioxane are obtained from 7.24 g (54 mmol) of terephthalic aldehyde, 9.13 g (120 mmol) of 1,3-propanediol and 0.2 g (1 mmol) of p-toluenesulfonic acid monohydrate in 100 ml of toluene; m.p. 164°-168° C. $^1$H-NMR (CDCl$_3$, 100 MHz): δ 7.47/s/4H, 5.49/s/2H, 3.85-4.4/m/8H, 2.4-2.0/m/2H, 1.6-1.3/m/2H.

Elementary analysis: calculated C 67.18% H 7.25% found C 66.10% H 7.24%.

Example 3

2,2'-(1,4-phenylene)bis-1,3-(5,5'-dimethyl)dioxane

In a 500 ml round-bottomed flask equipped with a water-separator, 200 ml of toluene are added to 15.0 g (111 mmol) of terephthalic aldehyde, 25.6 g (246 mmol) of 2,2-dimethyl-1,3-propanediol and 0.4 g (2 mmol) of p-toluenesulfonic acid monohydrate. After boiling under reflux for 4 hours, the reaction mixture is allowed to cool and is then filtered and recrystallised from methanol, yielding 10.2 g (33 mmol) of 2,2'-(1,4-phenylene)-bis-1,3-(5,5'-dimethyl)dioxane in the form of leaf-like crystals; m.p. 205°-206° C.

$^1$H-NMR, (CDCl$_3$, 300 MHz); δ 7.52/s/4H, 5.39/s/2H, 3.75/d/4H, 3.65/d/4H, 1.27/s/6H, 0.81/s/6H.

Example 4

1,4-bis(dipropoxymethyl)benzene

In a 500 ml round-bottomed flask equipped with a water-separator, 26.8 g (200 mmol) of terephthalic aldehyde, 52.9 g (880 mmol) of 1-propanol and 0.5 g (0.25 mmol) of p-toluenesulfonic acid monohydrate are dissolved in 200 ml of benzene. The reaction mixture is refluxed for 3 hours and allowed to cool and is washed once with 200 ml of 1N sodium hydroxide solution and then twice with water. The organic phase is dried over magnesium sulfate and concentrated, yielding 40.1 g (118 mmol, 59% of the theoretical yield) of 1,4-bis(dipropoxymethyl)benzene in the form of a clear oil that can be purified by distillation.

$^1$H-NMR (CDCl$_3$, 300 MHz): δ 7.90/d/2H, 7.65/d/2H, 5.57/s/1H, 5.52/s/1H, 3.47/m/8H, 1.65/m/8H, 0.95/m/12H.

EXAMPLES 5-10

Examples of Application

Example 5

A resist mixture is prepared by dissolving 260 parts of poly(p-hydroxystyrene) [Maruzen Petrochem. Comp.], 40 parts of 2,2'-(1,4-phenylene)bis-1,3-dioxolane and 10 parts of triphenylsulfonium trifluoromethanesulfonate in 600 parts of cyclohexanone. The resist solution is spin-coated onto a silicon wafer, a resist film having a thickness of 1.0 μm being obtained after drying at 120° C. for 2 minutes. The film is then contact-exposed through a chromium/quartz mask with a narrow band interference filter at 254 nm and at a dose of 10 mJ/cm$^2$ and then heated for 20 seconds at 130° C. and developed for 1 minute in a metal-ion-free developer based on a 2.38% aqueous solution of tetramethylammonium hydroxide, the unexposed areas of the resist film are completely dissolved. The resulting resist material allows resolution of 0.5 μm structures (isolated lines) having an edge angle of 92° and has a contrast value γ of 3.

Example 6

A resist formulation of 100 parts of an m-cresol-novolak, 20 parts of 2,2'-(1,4-phenylene)bis-1,3-dioxolane and 3.5 parts of triphenylsulfonium trifluoromethanesulfonate, dissolved in 350 parts of cyclopentanone, is spin-coated onto a silicon wafer and dried at 130° C. for 2 minutes, a resist film having a thickness of 1.0 μm being obtained. The film is exposed for 5 seconds using a UXM-502 MD lamp made by USHIO Comp., and is then heated for 30 seconds at 110° C. and developed for 60 seconds using a 2.38% aqueous solution of tetramethylammonium hydroxide. The resist has a sensitivity of 2 mJ/cm² and allows the resolution of submicron structures down to 0.75 μm l/s (l/s=lines and spaces) having approximately vertical wall profiles.

Example 7

A resist formulation consisting of 100 parts of poly(p-hydroxystyrene) supplied by Maruzen Petrochem. Comp., 40 parts of 2,2'-(1,4-phenylene)bis-1,3-dioxane and 13 parts of triphenylsulfonium trifluoromethanesulfonate, dissolved in 400 parts of cyclopentanone, is spin-coated onto a silicon wafer and dried for 2 minutes at 120° C., a homogeneous resist film having a thickness of 1.1 μm being obtained. That film is subjected to image-wise exposure at a wavelength of 254 nm (narrow band filter) and then heated for 30 seconds at 120° C. and then developed in a 2% solution of tetramethylammonium hydroxide in water for 1 minute, the unexposed areas of the resist film being dissolved. The resist material has a sensitivity of 30 mJ/cm² and is capable of resolving submicron structures down to 0.5 μm (isolated lines).

Example 8

A resist formulation consisting of 100 parts of poly(p-hydroxystyrene) supplied by Maruzen Petrochem. Comp., 40 parts of 2,2'-(1,4-phenylene)bis-1,3-dioxane and 10 parts of the compound of the formula

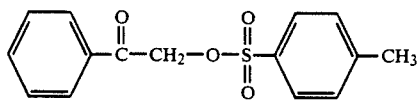

(phenacyl p-methylbenzenesulfonate), dissolved in 400 parts of cyclohexanone, is spin-coated onto a silicon wafer and dried for 2 minutes at 120° C., a homogeneous resist film having a thickness of 1.0 μm being obtained. After contact exposure (30 mJ/cm²) through a quartz mask with a narrow band filter at 254 nm, heating is carried out for 1 minute at 120° C. and then developing is carried out using a 1.6% solution of tetramethylammonium hydroxide in water. The resulting resist material allows the resolution of submicron structures down to 0.75 μm (isolated lines).

Example 9

By brushing on the resist formulation of Example 6 and subsequently drying in a hot oven, a resist film of 30 μm thickness is applied to a copper-clad circuit board and dried in a hot oven for 1 hour at 70° C. Image-wise exposure is then carried out for 10 seconds through a mask using a UXM-502 MD lamp made by Messrs Ushio. After heating at 120° C. for 30 seconds, developing is carried out using 0.5N sodium hydroxide solution, the unexposed areas of the film being dissolved, while the exposed areas remain behind in the form of relief structures of the original thickness.

Example 10

100 parts of poly(p-hydroxystyrene) supplied by Maruzen Petrochem. Comp., 40 parts of 1,4-bis(dipropoxymethyl)benzene and 10 parts of triphenylsulfonium trifluoromethanesulfonate are dissolved in 400 parts of cyclohexanone to form a resist solution. The solution is spin-coated onto a silicon wafer and dried for 1 minute at 100° C., a homogeneous film having a thickness of 1.5 μm being obtained. Image-wise exposure is carried out for 10 seconds through a quartz mask using a mercury vapour lamp. Heating is then carried out for 1 minute at 120° C. and then developing is carried out in 1N sodium hydroxide solution, the unexposed areas of the film being dissolved.

What is claimed is:

1. A photosensitive composition comprising
   a) at least one solid film-forming polyphenol,
   b) at least one compound of formula I

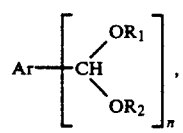

wherein n is 2, 3 or 4, Ar is an n-valent benzene or naphthalene radical or a divalent radical of formula II

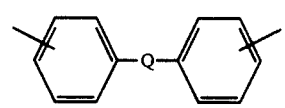

Q is a direct bond, —O—, —SO—, —SO₂—, —CH₂—, —C(CH₃)(phenyl)— or —C(CH₃)₂—, each of $R_1$ and $R_2$, independently of the other, is $C_1$-$C_8$alkyl, or phenyl or naphthyl each of which is unsubstituted or substituted by $C_1$-$C_4$alkyl, or $R_1$ and $R_2$ together are 1,2-phenylene or —[C(R')(R")-]$_m$—, each of R' and R", independently of the other, is hydrogen, $C_1$-$C_4$alkyl or phenyl and m is 2, 3 or 4, and c) at least one compound that forms an acid under actinic radiation.

2. A composition according to claim 1, wherein n is 2 and Ar is 1,3-phenylene or 1,4-phenylene.

3. A composition according to claim 2 wherein Ar is 1,4-phenylene.

4. A composition according to claim 1, wherein $R_1$ and $R_2$ in formula I have the same meaning.

5. A composition according to claim 4 wherein $R_1$ and $R_2$ are the same and are $C_1$-$C_4$alkyl.

6. A composition according to claim 1, wherein $R_1$ and $R_2$ in formula I are together 1,2-phenylene or —[C(R')(R")]$_m$— wherein R' and R" are independently H or methyl and m=2 or 3.

7. A composition according to claim 6 wherein $R_1$ and $R_2$ are —[C(R')(R")]$_m$— wherein R' and R" are independently H or methyl, and m=2 or 3.

8. A composition according to claim 1, wherein component b) is present in an amount of from 5 to 50% by weight, based on component a).

9. A composition according to claim 8 wherein the amount of component b) is from 10 to 30% by weight, based on component a).

10. A composition according to claim 1, comprising as further component d) a solvent or a mixture of solvents.

11. A composition according to claim 1, wherein component a) is a homo- or co-polymer having structural repeating units of formula III

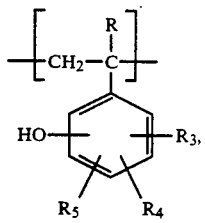 (III)

wherein R is hydrogen or methyl, and each of $R_3$, $R_4$ and $R_5$, independently of the others, is hydrogen, $C_1$-$C_4$alkyl, $C_1$-$C_4$alkoxy, halogen or methylol.

12. A composition according to claim 1, wherein component a) is a novolak.

13. A composition according to claim 12 wherein component a) is a phenol or cresol novolak.

14. A composition according to claim 1, wherein component a) is a poly(p-hydroxystyrene).

15. A composition according to claim 1, wherein component c) is a compound of formula V $$(Ar_1)_q(R_7)_r(R_8)_s S^{\oplus} X^{\ominus} \quad (V),$$

wherein $Ar_1$ is phenyl, naphthyl or phenyl—$COCH_2$— each of which is unsubstituted or substituted by halogen, $C_1$-$C_4$alkyl, $C_1$-$C_4$alkoxy, —OH or by nitro or mixture thereof $R_7$ is $C_1$-$C_6$alkyl or $C_3$-$C_7$cycloalkyl and $R_8$ is tetrahydrothienyl, tetrahydrofuryl or hexanydropyrryl, q is 0, 1, 2 or 3, r is 0, 1 or 2 and s is 0 or 1, the sum of q+r+s being 3, and $X^{\ominus}$ is a chloride, bromide or iodide anion, $BF_4^{\ominus}$, $PF_6^{\ominus}$, $AsF_6^{\ominus}$, $SbF_6^{\ominus}$, $FSO^{\ominus}$ or the anion of an organic sulfonic acid or carboxylic acid.

16. A composition according to claim 15, wherein $Ar_1$ is phenyl, q is the number 3, r and s are zero and $X^{\ominus}$ is $SbF_6^{\ominus}$, $AsF_6^{\ominus}$, $PF_6^{\ominus}$ or the anion of an aliphatic, partially fluorinated aliphatic or perfluorinated aliphatic sulfonic acid or of an aromatic, partially fluorinated aromatic or perfluorinated aromatic sulfonic acid.

17. A composition according to claim 16 wherein $X^-$ is the anion of an aliphatic, partially fluorinated aliphatic or perfluorinated aliphatic sulfonic acid or of an aromatic, partially fluorinated aromatic or perfluorinated aromatic sulfonic acid.

18. A composition according to claim 15, wherein $Ar_1$ is phenyl, q is the number 3, r and s are zero and $X^{\oplus}$ is $CF_3SO_3^{\oplus}$, $C_2F_5SO_3^{\oplus}$, n-$C_3F_7SO_3^{\oplus}$, n-$C_4F_9SO_3^{\oplus}$, n-$C_6F_{13}SO_3^{\oplus}$, n-$C_8F_{17}SO_3^{\oplus}$ or $C_6F_5SO_3^{\oplus}$.

19. A composition according to claim 15, wherein component c) is phenacyl-p-methylbenzenesulfonate or triphenylsulfonium trifluoromethanesulfonate.

20. A composition according to claim 19 wherein component c) is triphenylsulfonium trifluoromethanesulfonate.

21. A composition according to claim 1, wherein component c) is present in an amount of from 1 to 30% by weight, based on components a)+b).

22. A composition according to claim 21 wherein the amount of component c) is from 1 to 10% by weight, based on components a)+b).

* * * * *